(12) United States Patent
Zhu et al.

(10) Patent No.: US 9,401,425 B2
(45) Date of Patent: Jul. 26, 2016

(54) SEMICONDUCTOR STRUCTURE AND METHOD FOR MANUFACTURING THE SAME

(71) Applicant: Institute of Microelectronics, Chinese Academy of Sciences, Beijing (CN)

(72) Inventors: Huilong Zhu, Poughkeepsie, NY (US); Haizhou Yin, Poughkeepsie, NY (US); Zhijiong Luo, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 14/437,755

(22) PCT Filed: Nov. 27, 2012

(86) PCT No.: PCT/CN2012/085353
§ 371 (c)(1),
(2) Date: Apr. 22, 2015

(87) PCT Pub. No.: WO2014/063404
PCT Pub. Date: May 1, 2014

(65) Prior Publication Data
US 2015/0279993 A1  Oct. 1, 2015

(30) Foreign Application Priority Data
Oct. 26, 2012  (CN) .......................... 2012 1 0417331

(51) Int. Cl.
*H01L 29/78* (2006.01)
*H01L 29/10* (2006.01)
(Continued)

(52) U.S. Cl.
CPC ...... *H01L 29/7848* (2013.01); *H01L 21/02381* (2013.01); *H01L 21/02529* (2013.01);
(Continued)

(58) Field of Classification Search
None
See application file for complete search history.

(56) References Cited

U.S. PATENT DOCUMENTS

2007/0018205 A1  1/2007  Chidambarrao et al.
2009/0032880 A1*  2/2009  Kawaguchi ......... H01L 21/3065
257/369

FOREIGN PATENT DOCUMENTS

| CN | 101405848 | 4/2009 |
| CN | 101872725 | 10/2010 |
| CN | 102437184 | 5/2012 |

OTHER PUBLICATIONS

International Search Report for PCT/CN2012/085353 mailed Aug. 8, 2013.
(Continued)

*Primary Examiner* — Fei Fei Yeung Lopez
(74) *Attorney, Agent, or Firm* — Paul M. H. Pua; Foley & Lardner LLP

(57) ABSTRACT

A semiconductor structure is disclosed. The semiconductor structure comprises: a substrate (130), a support structure (131), a base region (100), a gate stack, a spacer (240), and a source/drain region, wherein the gate stack is located on the base region (100), and the base region (100) is supported on the substrate (130) by the support structure (131), wherein the sidewall cross-section of the support structure (131) is in a shape of a concave curve; an isolation structure (123) is formed beneath the edges on both sides of the base region (100), wherein a portion of the isolation structure (123) is connected to the substrate (130); a cavity (112) is formed between the isolation structure (123) and the support structure (131); and there exists a source/drain region at least on both sides of the base region (100) and the isolation structure (123). Accordingly, a method for manufacturing the semiconductor structure is also disclosed.

6 Claims, 13 Drawing Sheets

(51) Int. Cl.
    *H01L 21/8234* (2006.01)
    *H01L 29/66* (2006.01)
    *H01L 29/06* (2006.01)
    *H01L 21/02* (2006.01)
    *H01L 21/306* (2006.01)
    *H01L 21/308* (2006.01)
    *H01L 21/762* (2006.01)
    *H01L 29/16* (2006.01)
    *H01L 29/161* (2006.01)
    *H01L 29/165* (2006.01)

(52) U.S. Cl.
    CPC ........ *H01L21/02532* (2013.01); *H01L 21/308* (2013.01); *H01L 21/30604* (2013.01); *H01L 21/76224* (2013.01); *H01L 21/823412* (2013.01); *H01L 21/823425* (2013.01); *H01L 21/823481* (2013.01); *H01L 29/0653* (2013.01); *H01L 29/1054* (2013.01); *H01L 29/161* (2013.01); *H01L 29/165* (2013.01); *H01L 29/1608* (2013.01); *H01L 29/6656* (2013.01); *H01L 29/66636* (2013.01); *H01L 29/66628* (2013.01)

(56) References Cited

OTHER PUBLICATIONS

International Preliminary Report on Patentability for PCT/CN2012/085353 mailed Apr. 28, 2015.

\* cited by examiner

SEMICONDUCTOR STRUCTURE AND METHOD FOR MANUFACTURING THE SAME

CROSS REFERENCE TO RELATED APPLICATION

This application is a national stage application, filed under 35 U.S.C. §371, of PCT Application No. PCT/CN2012/085353, filed on Nov. 27, 2012, entitled "SEMICONDUCTOR STRUCTURE AND MANUFACTURING METHOD THEREOF", which claims the benefits of prior Chinese Patent Application No. 201210417331.6 filed on Oct. 26, 2012, titled "SEMICONDUCTOR STRUCTURE AND METHOD FOR MANUFACTURING THE SAME", all of which are incorporated herein by reference in their entirety.

TECHNICAL FIELD

The present disclosure relates to the field of semiconductor technology. In particular, the present disclosure relates to a semiconductor structure and a method for manufacturing the same.

BACKGROUND ART

Industrial demand requires IC circuits to have a higher density so as to reduce the size of the MOS transistor. However, the reduction of the size of the MOS transistor results in the emergence of the two well-known parasitic effects, i.e., short channel effect emerging as a result of the reduction of the gate length and drain induced barrier lowering effect, which may easily deteriorate electrical properties of the device, such as reduction of the gate threshold voltage, increase in power consumption, and signal-to-noise ratio (SNR) decline. Physically, the above effects can be explained as follows: when the transistor is turned off (the gate voltage is zero), static electricity impact of the source/drain region in a very small device or voltage applied to the drain electrode on the channel region reduces the energy barrier of electrons or holes in the channel, and results in a higher turn-off current.

In order to control the short channel effect, more impurity elements such as phosphorus, boron and the like have to be doped in the channel, which may easily lead to the reduction of the mobility of carries in the device channel. Moreover, the distribution used to dope dopants into the channel can hardly control the problem of steepness, which may easily result in severe short channel effects. The thickness of gate oxides will also encounter a bottleneck problem of development, the thinning rate in the gate oxide thickness can hardly keep up with the reducing pace of the gate width, and gate dielectric leakage is increasing; critical dimensions continue to shrink, which may easily cause the resistance of the source/region to increase continuously and the power consumption of the device to become greater.

Strained silicon technology can control short channel effects effectively. Strained silicon has been used as an MOS transistor of a substrate, which uses the different characteristics of the lattice constant of silicon germanium from monocrystalline silicon to make the epitaxial layer of silicon germanium produce structural strain so as to form strained silicon. Since the lattice constant of the SiGe layer is greater than that of silicon, mechanical stress is generated in the channel region, which causes changes of carrier mobility. In FET, tensile stress can increase electron mobility and reduce hole mobility, and can advantageously improve the performance of NMOS devices; while compressive stress can increase hole mobility and reduce electron mobility, and can advantageously improve the performance of PMOS devices.

However, the traditional silicon germanium strained silicon technology also begins to face bottlenecks, which can hardly provide stronger strain to the channel and cannot effectively enhance the performance of the semiconductor device.

SUMMARY OF THE DISCLOSURE

In order to solve the above problems, the present disclosure provides a semiconductor structure and its manufacturing method, which are advantageous in providing the channel with good stress effect and increasing the steepness of the source/drain region, thereby suppressing the short channel effect.

According to one aspect of the present disclosure, there is provided a method for manufacturing a semiconductor structure, comprising the following steps:

a) providing a substrate, wherein a gate stack and a first spacer surrounding the gate stack are formed on the substrate;
b) removing part of the substrate located on both sides of the gate stack to form a device stack;
c) forming a second spacer on both sides of the device stack;
d) using the device stack with a second spacer as a mask to etch the substrate located on both sides of the device stack so as to form a recess located on both sides of the device stack and a support structure below the device stack, wherein by controlling the etching, the sidewall cross-section of the recess is protruded to be a curve-shape just below the device stack;
e) forming a first semiconductor layer to fill the recess;
f) removing part of the first semiconductor layer located on both sides of the device stack and retaining the first semiconductor layer having a certain thickness;
g) in a partial region in the width direction of the device stack, removing the first semiconductor layer located on both sides of the device stack so as to expose the substrate;
h) in the partial region in the direction of the width of the device stack, forming an isolation structure connected to the substrate below the second spacer and edges on both sides of the device stack;
i) removing the remaining first semiconductor layer to form a cavity between the support structure and the isolation structure; and
j) removing the second spacer, and forming a source/drain region on both sides of the device stack.

According to another aspect of the present disclosure, there is further provided a semiconductor structure comprising a substrate, a support structure, a base region, a gate stack, a spacer, and a source/drain region, wherein:

the gate stack is located on the base region and the base region is supported on the substrate by the support structure;

the sidewall cross-section of the support structure is in a shape of concave curve;

an isolation structure is formed below the edges on both sides of the base region, wherein part of the isolation structure is connected to the substrate;

a cavity is formed between the isolation structure and the support structure; and a source/drain region is formed at least on both sides of the base region and an isolation structure.

Compared with the prior art, the technical solutions provided by the present disclosure have the following advantages. Since there exists a cavity below the channel, the stress of the stress material source/drain region on both sides of the channel can act on the channel more concentratedly, thereby effectively enhancing the impact of stress on the channel carrier mobility and enhancing the control on the channel performance. Furthermore, the presence of the cavity below the channel is also beneficial to enhance the steepness of the source/drain region, thereby suppressing the short channel effect and improving the performance of the semiconductor devices.

BRIEF DESCRIPTION OF THE FIGURES

By reading the detailed description of the non-limiting embodiments made with reference to attached drawings, the other features, objects and advantages of the present disclosure will become more apparent.

DESCRIPTION OF THE PREFERRED EMBODIMENTS

The embodiments of the present disclosure are described in detail below.

Illustrative examples of said embodiments are shown in the figures, wherein the same or similar reference numbers denote the same or similar components or components having the same or similar functions. The examples described with reference to the attached drawings are exemplary, and can be used for explaining the present disclosure only, and cannot be construed as limiting the present disclosure. The following disclosure provides many different embodiments or examples used to achieve different structures of the present disclosure. In order to simplify the disclosure of the present disclosure, members of specific examples and settings thereof will be described hereinafter. Of course, they are merely exemplary, and are not intended to limit the present disclosure. In addition, numbers and/or letters in the present disclosure can be repeated in different examples. Such repetition is for the purpose of simplification and clarity, and does not indicate the relationship between the various embodiments and/or settings discussed. Further, the present disclosure provides examples of a variety of particular processes and materials, but those skilled in the art may be aware of the applicability of other processes and/or the use of other materials. In addition, the structure where the first feature is "above" the second feature described below may include an embodiment where the first and second features are formed as a direct contact, and may also include an embodiment where additional features are formed between the first and second features, so that the first and second features may not be in direct contact.

Figure 12:
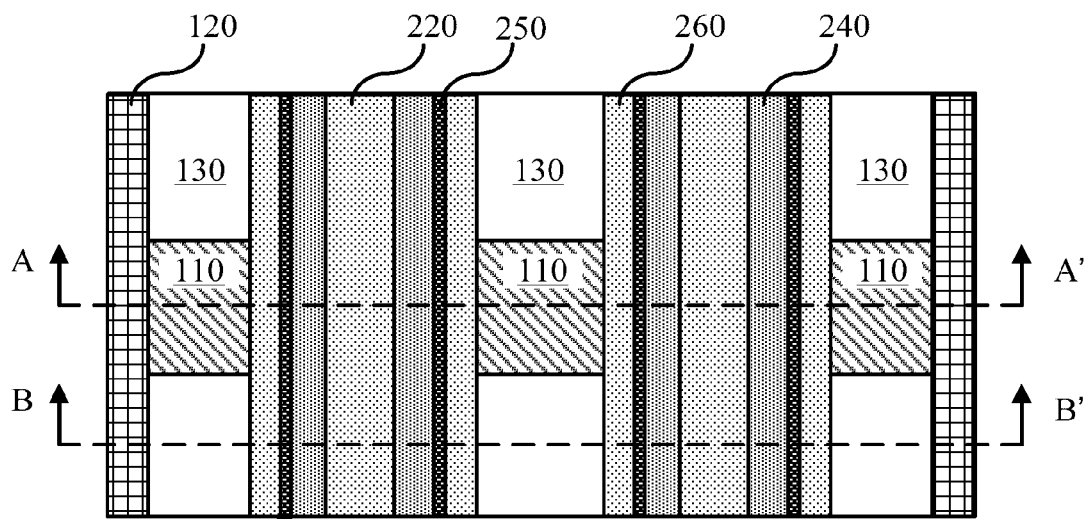
FIG. 12 is a schematic top view after forming an isolation structure.
Figure 14:
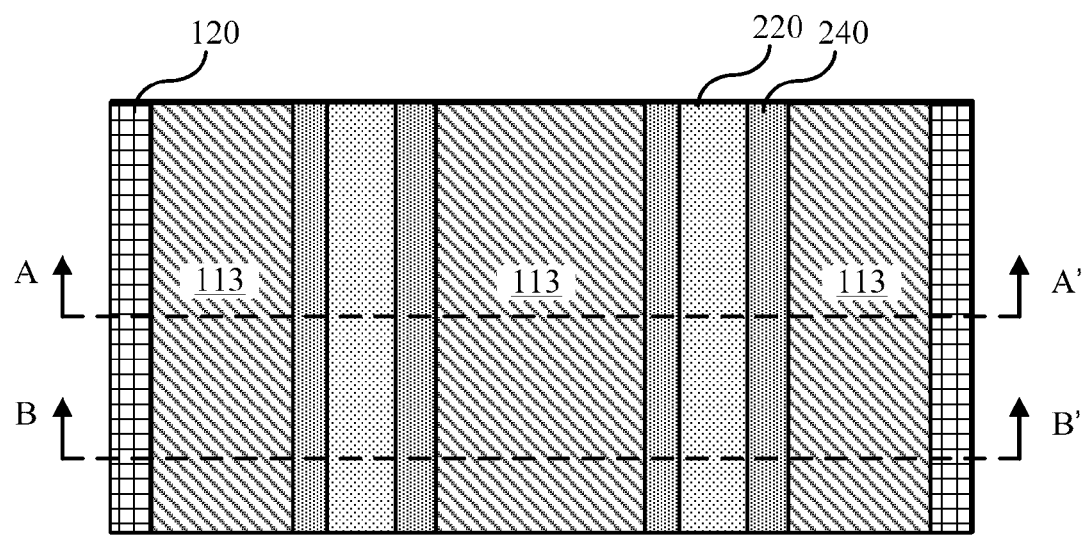
FIG. 14 is a schematic top view after filling stress materials on both sides of the gate stack.
Figure 14A:
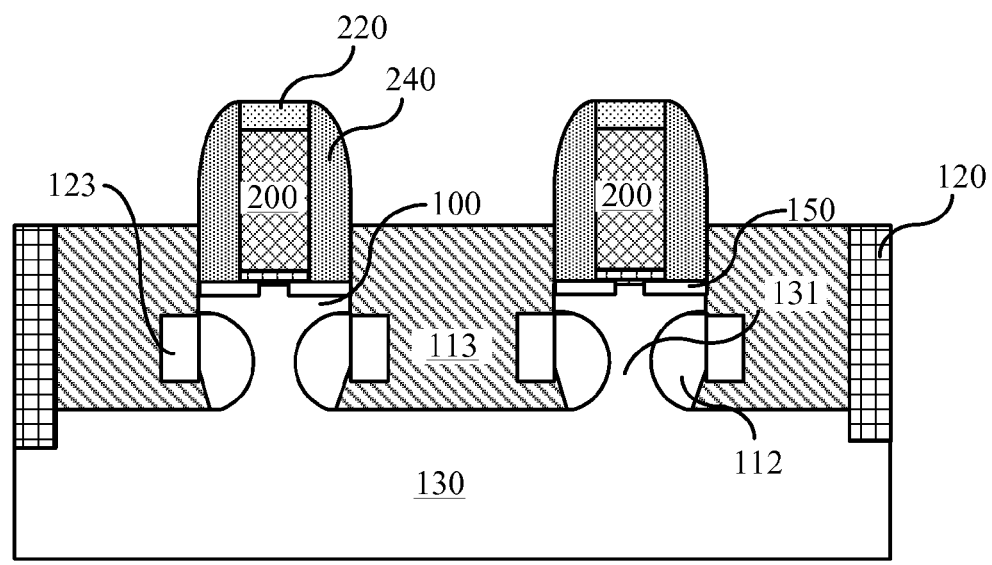
FIGS. 14a and 14b are cross-sectional views of FIG. 14 along the sectional line AA' and along the sectional line BB', respectively.
Figure 14B:
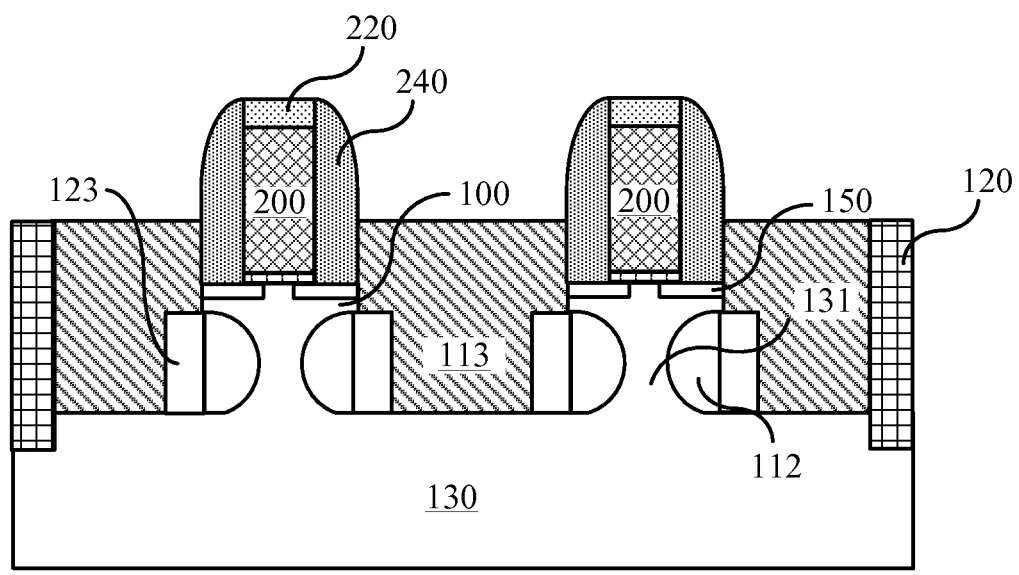

According to one aspect of the present disclosure, there is provided a semiconductor structure (please refer to FIG. 14, FIG. 14a and FIG. 14b), wherein FIG. 14 is a schematic top view of the semiconductor structure, and FIGS. 14a and 14b are schematic top views of FIG. 12 along the sectional line AA' and the sectional line BB', respectively. As shown in the figures, the semiconductor structure comprises a substrate 130, a support structure 131, a base region 100, a gate stack, a spacer 240, and a source/drain region 113, wherein the gate stack is located above the base region 100, and the base region 100 is supported on the substrate 130 by a support structure 131; the sidewall cross-section of the support structure 131 is in a shape of concave curve, for example, a concave arc or a similar shape; there exists an isolation structure 123 below the edges on both sides of the base region 100, wherein part of the isolation structure 123 is connected to the substrate 130; there exists a cavity 112 between the isolation structure 123 and the support structure 131; and there exists a source/drain region 113 at least on both sides of the base region 100 and the isolation structure 123.

Specifically, in the present embodiment, the material of the substrate 130 is a monocrystalline Si. In other embodiments, the material of the substrate 130 may be a polycrystalline Si, polycrystalline Ge, polycrystalline SiGe, amorphous Si, amorphous Ge, amorphous SiGe, Group III-V or II-VI compound semiconductor, or any combination thereof. The substrate 130 has a thickness in the range of 0.1 nm to 2 mm.

The base region 100 is supported on the substrate 130 by a support structure 131. The channel of the semiconductor structure is formed in the base region 100. In this present embodiment, the material of the base region 100 is a monocrystalline Si; in other embodiments, the material of the base region 100 may be any other suitable material. The base region 100 has a thickness in the range of 10 nm to 30 nm.

Part of the isolation structure 123 is connected to the substrate 130, i.e., there is a certain distance between part of the isolation structure 123 and the substrate 130 as they are not in direct contact. Since the sidewall cross-section of the support structure 131 is in a shape of concave curve, the isolation structure 123 and the support structure 131 located between the base region 100 and the substrate 130 surrounds a cavity 112. In the present embodiment, the material of the isolation structure 123 and the material of the substrate 130 and the base region 100 are the same, i.e., monocrystalline Si. In other embodiments, the material of the isolation structure 123 may be any other suitable semiconductor materials.

The gate stack comprises a gate dielectric layer 102, a gate 200, and a cap layer 220, wherein the gate dielectric layer 102 is located on the base region 100, the gate 200 is located on the gate dielectric layer 102, and the cap layer 220 is located on the gate 200 for protecting the gate 200 from being damaged in the subsequent steps. The material of the gate 200 can be selected from Poly-Si, Ti, Co, Ni, Al, W, alloys, metal silicides, and any combination thereof. The gate dielectric layer 102 may be a thermal oxide layer including silicon oxide and silicon oxynitride, or can be a high K dielectric, such as one of $HfO_2$, HfSiO, HfSiON, HfTaO, HfTiO, HfZrO, $Al_2O_3$, $La_2O_3$, $ZrO_2$, LaAlO, or any combination thereof. The gate dielectric layer 102 may have a thickness of 2 nm to 10 nm, for example, 5 nm or 8 nm. The cap layer 220 can be selected from nitrides of silicon and has a thickness in the range of 10 nm to 40 nm, for example, 10 nm or 20 nm. The spacer 240 (which is also referred to as "a first spacer") surrounds the sidewalls of the gate dielectric layer 102, the gate 200 and the cap layer 220. The material of the first spacer 240 comprises one of silicon nitride, silicon oxide, silicon oxynitride, silicon carbide, or any combination thereof, and/or other suitable materials. The spacer 240 may be a monolayer structure, or may have a multilayer structure. The spacer 240 has a thickness in the range of 10 nm to 100 nm, for example, 30 nm, 50 nm or 80 nm.

The source/drain region 113 is located on both sides of the gate stack with a spacer 240, the base region 100 and the isolation structure 123. The upper surface of the source/drain region is higher than or at the same level as the bottom of the gate stack. As for PFET devices, the material of the source/drain region is boron-doped $Si_{1-x}Ge_x$, wherein X ranges from 0.1 to 0.7, such as 0.2, 0.3, 0.4, 0.5 or 0.6. As for NFET devices, the material of the source/drain region is phosphorus or arsenic-doped Si:C, wherein the percentage of C ranges from 0.2% to 2%, such as 0.5%, 1% or 1.5%. The presence of the stress material silicon germanium or silicon carbide is advantageous for further regulating the stress within the channel region so as to enhance the mobility of carriers within the channel region. Besides, due to the presence of silicon germanium or silicon carbide, for PFET devices, it has an N-type super steep retrograde well structure; and for NFET devices, it has a P-type super steep retrograde well structure.

Preferably, the semiconductor structure provided by the present disclosure comprises a source/drain extension region 150, which is located in the part of the base region 100 adjacent to the source/drain region.

The semiconductor structure provided in the present disclosure has the following advantages: since there exists a cavity below the channel, the stress of the silicon germanium or silicon carbide on both sides of the channel can be applied on the channel more concentratedly, thereby effectively enhancing the impact of the channel on the mobility of the carrier and enhancing the control on the performance of the channel. Besides, the presence of the cavity below the channel is also advantageous for enhancing the steepness of the source/drain region, thereby suppressing the short channel effect and enhancing the performance of the semiconductor device.

Figure 1:
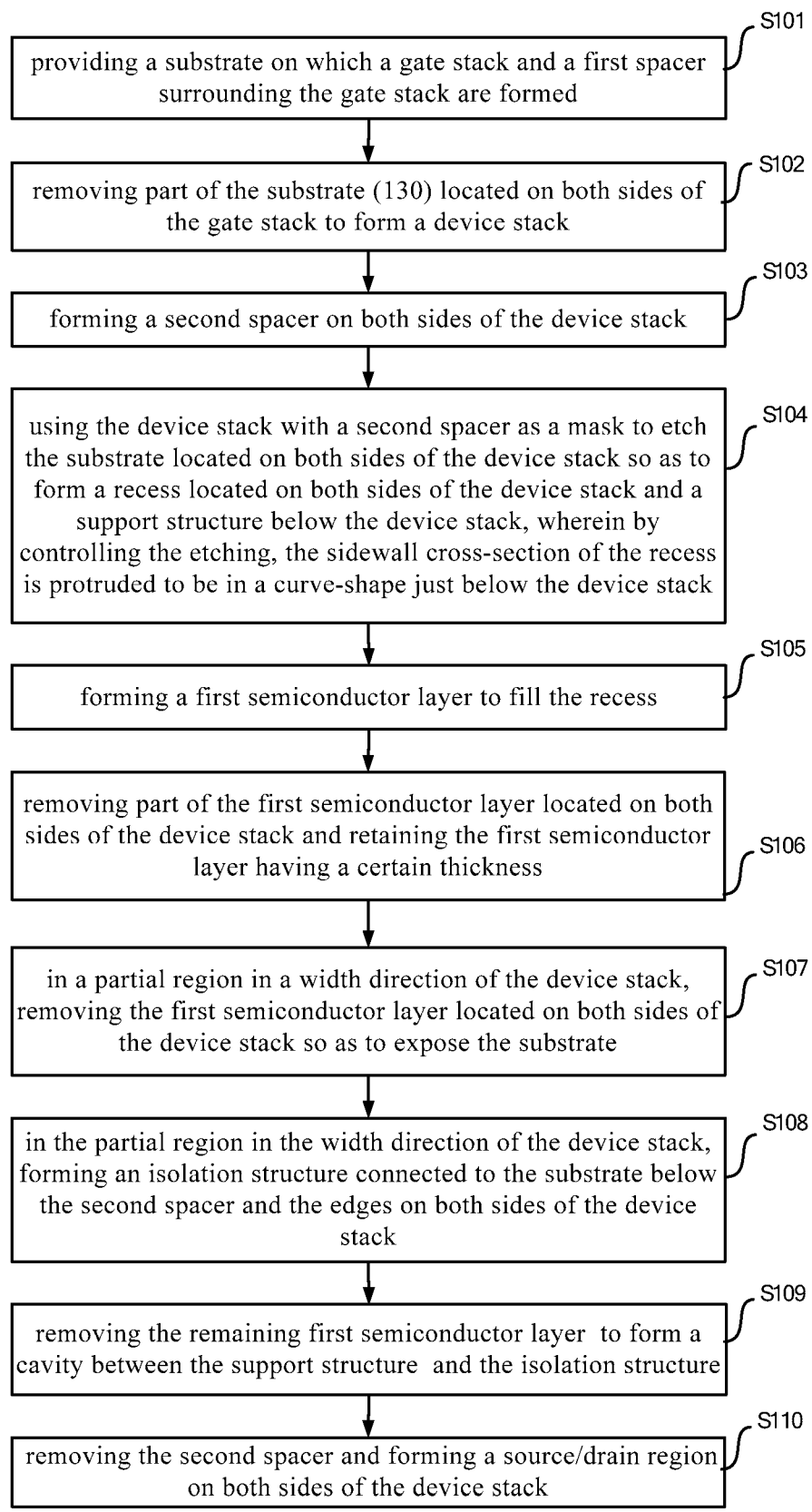
FIG. 1 is a flowchart of a method for manufacturing a semiconductor structure according to the disclosure.

According to another aspect of the present disclosure, there is further provided a method for manufacturing a semiconductor structure. The method for forming a semiconductor structure of FIG. 1 is described in detail below through one embodiment of the present disclosure in combination with FIG. 2 to FIG. 14b. As shown in FIG. 1, the manufacturing method provided by the present disclosure comprises the following steps:

In step S101, there is provided a substrate 130 on which a gate stack and a first spacer 240 surrounding the gate stack are formed.

Figure 2:
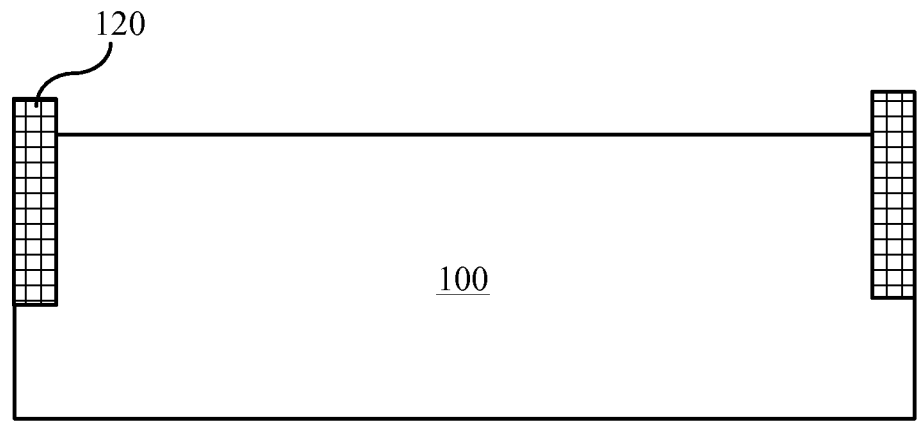
FIG. 2 is a schematic cross-sectional view of a substrate.

Specifically, as shown in FIG. 2, a substrate 130 is first provided, wherein in the present embodiment, the material of the substrate 130 is monocrystalline Si. In other embodiments, the material of the substrate 130 may be polycrystalline Si, polycrystalline Ge, polycrystalline SiGe, amorphous Si, amorphous Ge, amorphous SiGe, Group III-V or II-VI compound semiconductor or any combination thereof. The substrate 130 has a thickness in the range of 0.1 nm to 2 mm. Typically, an isolation structure, for example, a shallow trench isolation (STI) structure 120 is formed in the substrate 130, so as to electrically isolate the continuous semiconductor device.

Figure 3:
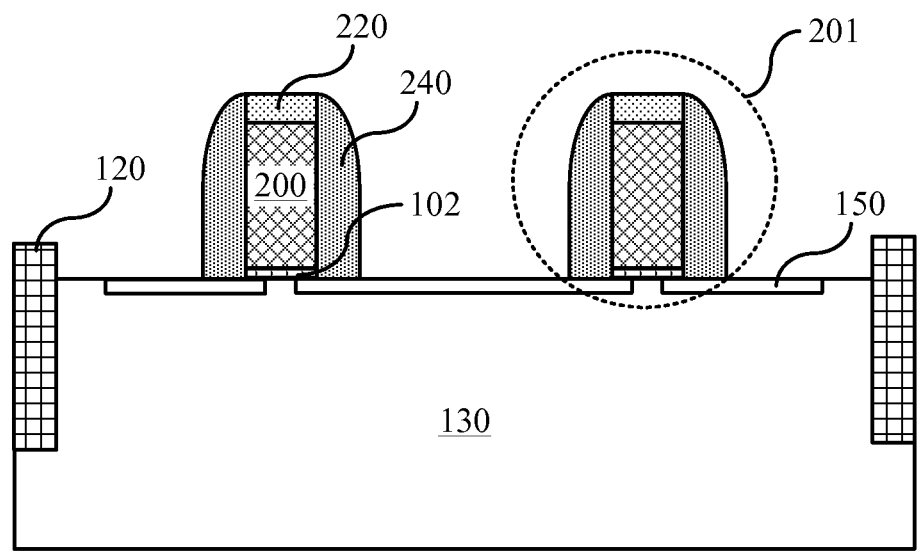
FIG. 3 is a schematic cross-sectional view after forming a gate stack.

Next, as shown in FIG. 3, a gate dielectric layer 102, a gate 200 and a cap layer 220 are formed on the substrate 130 successively to constitute a gate stack, wherein the gate dielectric layer 102 is located on the substrate 130, the gate 200 is located on the gate dielectric layer 102, and the cap layer 220 is located on the gate 200, so that the gate 200 is protected from being damaged in the subsequent steps. The material of the gate electrode 200 can be selected from Poly-Si, Ti, Co, Ni, Al, W, alloys, metal silicides, and any combination thereof. The gate dielectric layer 102 may be a thermal oxide layer including silicon oxide or silicon oxynitride, or can be a high K dielectric, such as one of $HfO_2$, HfSiO, HfSiON, HfTaO, HfTiO, HfZrO, $Al_2O_3$, $La_2O_3$, $ZrO_2$, LaAlO, or any combination thereof. The gate dielectric layer 102 may have a thickness of 2 nm to 10 nm, for example, 5 nm or 8 nm. The cap layer 220 may be selected from silicon nitride and has a thickness in the range of 10 nm to 40 nm, for example, 10 nm or 20 nm. After forming a gate stack, the surface of the substrate located on both sides of the gate stack is lightly doped for forming a source/drain extension region 150. As for PFET devices, P-type dopants, such as boron and indium, are doped in the substrate 130; as for NFET devices, N-type dopants, such as arsenic and phosphorus, are doped in the substrate 130. After forming a source/drain extension region 150, a first spacer 240 surrounding the sidewalls of the gate dielectric layer 102, the gate 200 and the cap layer 220 is formed. The material of the spacer 240 comprises one of silicon nitride, silicon oxide, silicon oxynitride, silicon carbide, or any combination thereof, and/or other suitable materials. The spacer 240 may be a monolayer structure, or may have a multilayer structure. The spacer 240 has a thickness in the range of 10 nm to 100 nm, for example, 30 nm, 50 nm or 80 nm.

In step S102, part of the substrate 130 located on both sides of the gate stack is removed to form a device stack.

Figure 4:
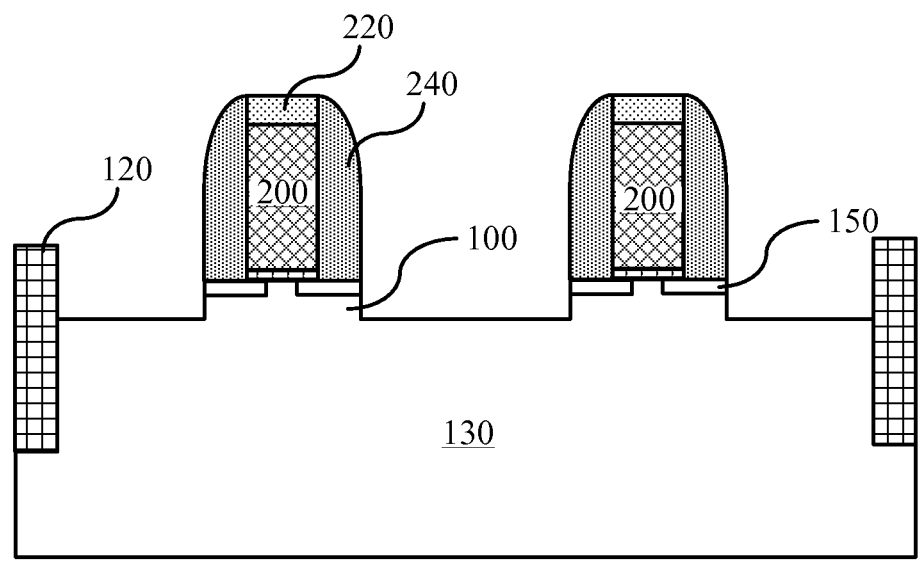
FIG. 4 is a schematic cross-sectional view after forming a device stack.

Specifically, as shown in FIG. 4, the gate stack with a spacer 240 is used as a mask to etch and remove part of the substrate 130 on both sides of the gate stack to form a base region 100 below the gate stack. The base region 100 and the gate stack above as well as the first spacer 240 form a device stack. In the present embodiment, the etching depth is in the range of 10 nm to 30 nm. The etching is preferably dry etching, and the dry etching method may comprise plasma etching, ion milling, reverse sputtering, and reactive ion etching. In the present embodiment, reactive ion etching is employed.

In step S103, a second spacer 260 is formed on the sidewalls of the device stack.

Figure 5:
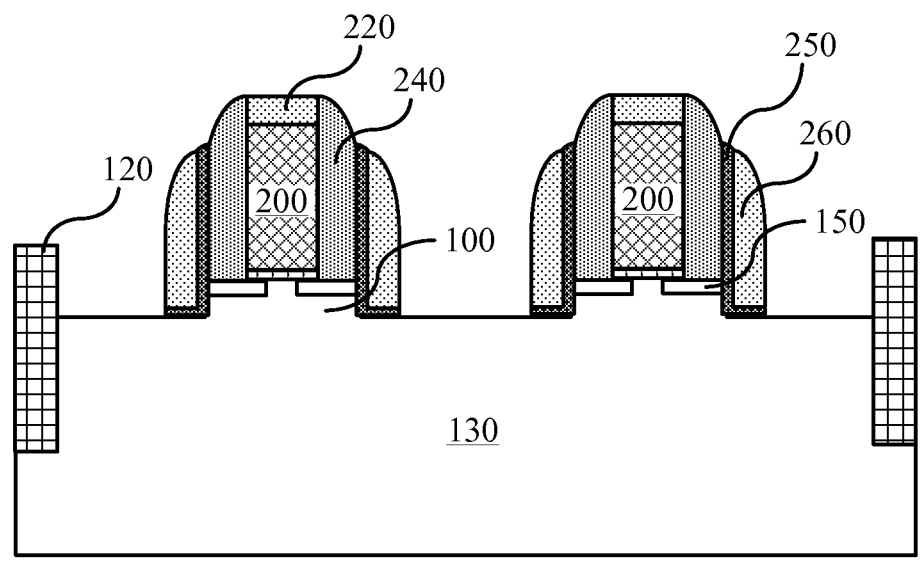
FIG. 5 is a schematic cross-sectional view after forming a stop layer and a second spacer on side surfaces of the device stack.

Specifically, as shown in FIG. 5, a first insulation layer (not shown) is deposited on the entire semiconductor structure, and then a second insulation layer (not shown) is deposited on the first insulation layer. Then, the second insulation layer and the first insulation layer are etched to form an etching stop layer 250 surrounding the device stack and a spacer 260 (which is referred to as a second spacer 260 hereinafter) surrounding the etching stop layer 250, wherein the material of the second spacer 260 comprises one of silicon nitride, silicon oxide, silicon oxynitride, silicon carbide, or any combination thereof, and/or other suitable materials, its thickness being in the range of 5 nm to 10 nm. The material of the etching stop layer 250 is preferably an insulating material different from those of the first spacer 240 and the second spacer 260. For example, the material of the first spacer 240 and the second spacer 260 is silicon nitride, while the material of the etching stop layer 250 is silicon oxide. The etching stop layer 250 has a thickness in the range of 1 nm to 3 nm In step S104, the device stack with a second spacer 260 is used as a mask to etch the substrate 130 located on both sides of the device stack, so as to form a recess 160 located on both sides of the device stack and a support structure 131 below the device stack. By controlling etching, the sidewall cross-section of the recess is protruded to be in a curve-shape just below the device stack.

Figure 6:
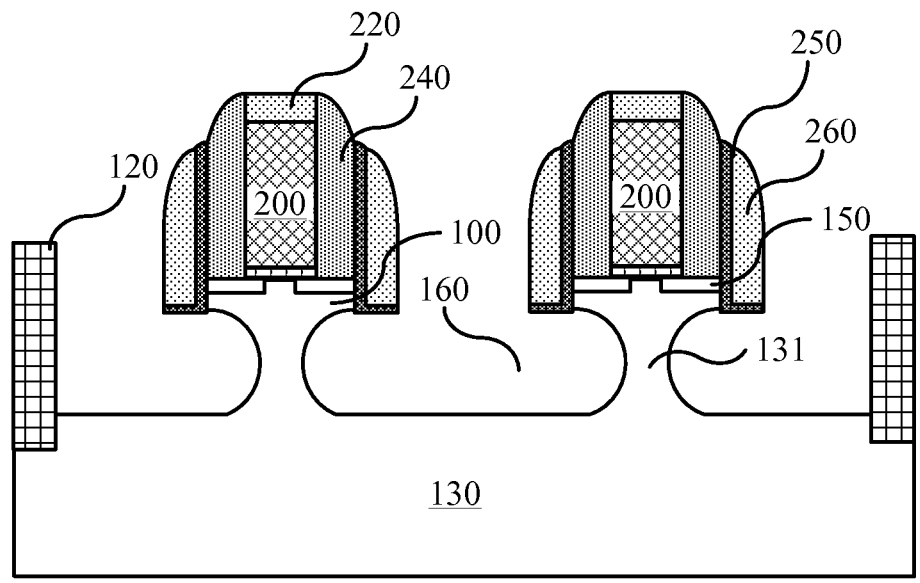
FIG. 6 is a schematic cross-sectional view after forming a recess on both sides of and below the device stack.

Specifically, the device stack with a second spacer 260 is used as a mask, and a process such as isotropic dry or wet etching is employed to etch the substrate 130. Isotropic dry or wet etching process is a well known technique to those skilled in the art. For the sake of brevity, no further comment is made herein. As shown in FIG. 6, isotropic etching process is employed. Thus, not only part of the substrate 130 located on both sides of the device stack is removed, but also part of the substrate 130 located below the device stack is removed. It should be noted that during the isotropic etching process, by controlling isotropic etching process parameters (e.g., etching time, composition of etching gases, etc.), the sidewall cross-section of the recess is protruded to be in a curve-shape just below the device stack (having a certain curvature, e.g., arc or a similar shape), such that the substrate 130 below the device stack is not etched through in order to support the device stack. After isotropic etching, a recess 160 located on both sides of the device stack and a support structure 131 below the base region 100 are formed, wherein the sidewall cross-section of the recess 160 is protruded to be in a curve shape just below the device stack. Correspondingly, the sidewall cross-section of the support structure 131 is in a shape of concave curve. The support structure 131 is used for connecting the substrate 130 and the device stack and supporting the device stack as well.

In step S105, a first semiconductor layer 110 filling the recess is formed.

Figure 7:
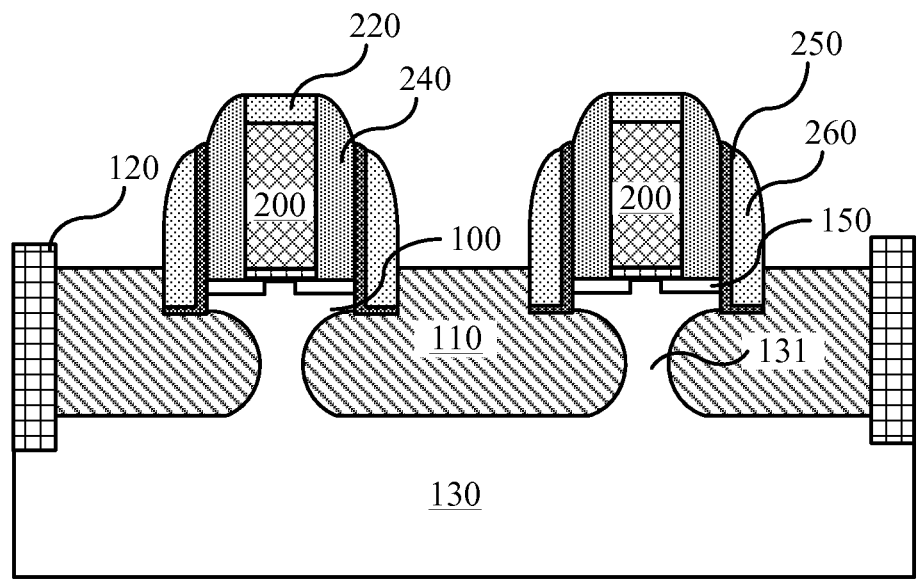
FIG. 7 is a schematic cross-sectional view after filling the recess to form a semiconductor layer.

Specifically, as shown in FIG. 7, the recess located on both sides of the device stack with a second spacer 260 is filled by selective epitaxial growth to form a semiconductor layer 110 (which is referred to as a first semiconductor layer 110). In the present embodiment, the material of the first semiconductor layer 110 is SiGe, wherein the proportion of the Ge element is between 10% and 20%. It should be noted that the upper surface of the first semiconductor layer 110 is no lower than the lower surface of the etching stop layer 250. In addition, as shown in FIG. 7, since the sidewall cross-section of the recess is protruded to be in a curve-shape just below the device stack, the first semiconductor layer 110 formed by selective epitaxial growth is protruded to be just below the device stack.

In step S106, part of the first semiconductor layer 110 located on both sides of the device stack is removed and the first semiconductor layer 110 having a certain thickness is retained.

Figure 8:
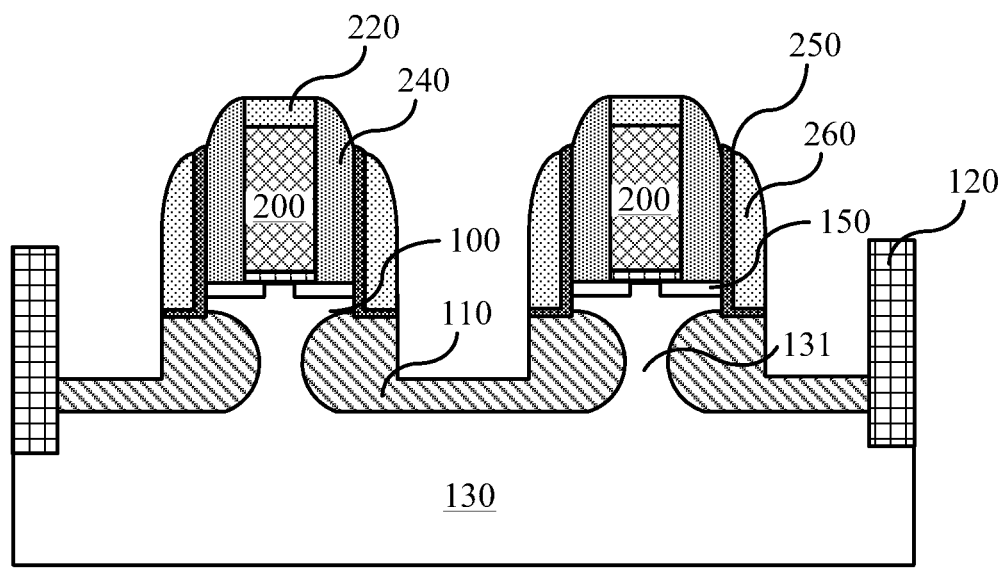
FIG. 8 is a schematic cross-sectional view after etching part of the semiconductor layer.

Specifically, as shown in FIG. 8, the device stack with a second spacer 260 is used as a mask, and processes such as dry etching are used to etch the first semiconductor layer 110 located on both sides of the second spacer 260. During the etching process, the first semiconductor layer 110 is not completely removed, instead, the first semiconductor layer 110 having a certain thickness is retained on both sides of the second spacer 260. In addition, since the selected etching is anisotropic (etching substantially in the vertical direction), the part of the first semiconductor layer 110 which is protruded to be just below the device stack is retained.

Figure 10:
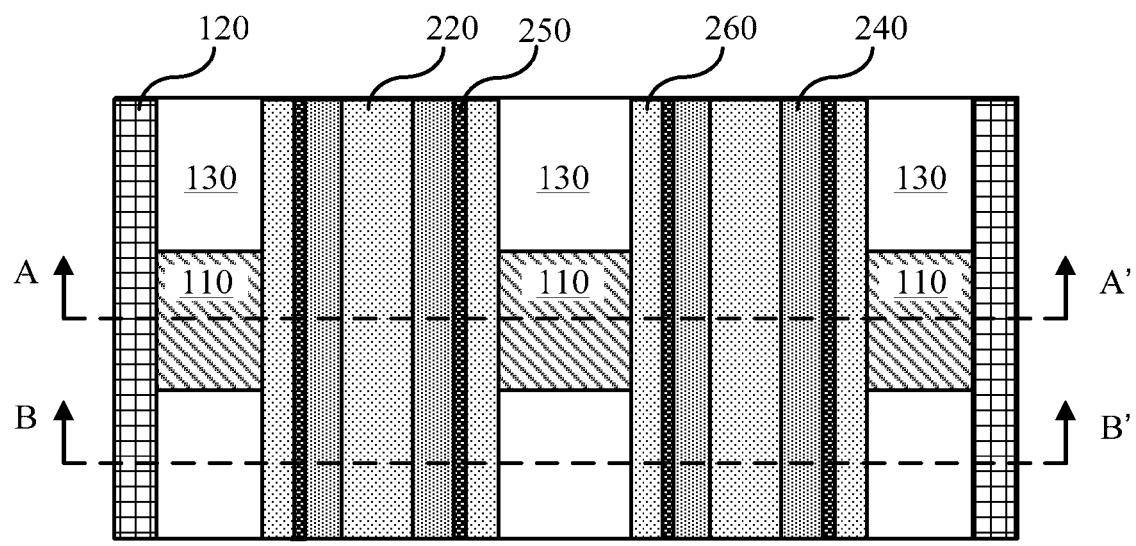
FIG. 10 is a schematic top view of etching the semiconductor layer to expose part of the substrate and removing the photolithographic mask.

In step S107, in part of the region of the device stack along the width direction, the first semiconductor layer 110 located on both sides of the device gate is removed so as to expose the substrate 130. The above width is defined based on the channel of the semiconductor device to be formed. The current direction in the channel is a length direction, and the direction vertical thereto is a width direction. Namely, the left-right direction in FIG. 10 is a longitudinal direction, and the direction perpendicular thereto on the paper sheet is a width direction.

Figure 9:
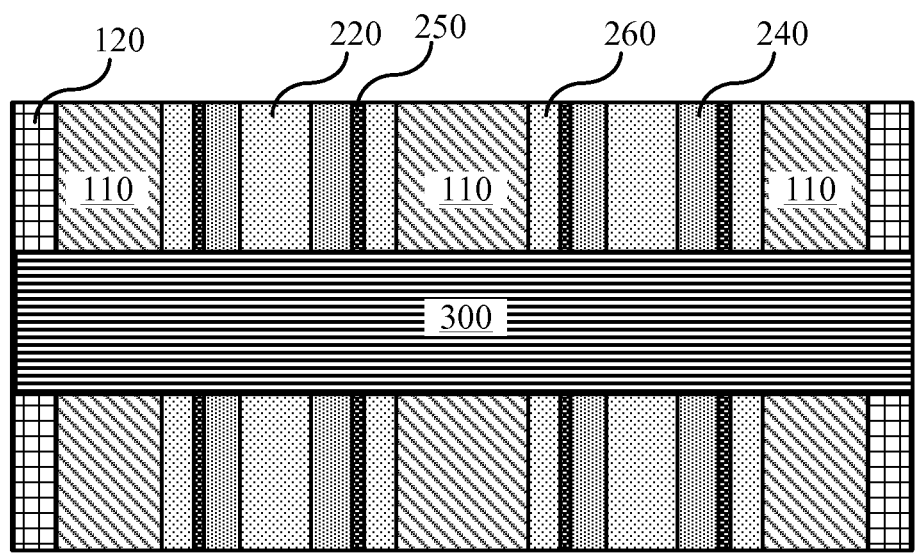
FIG. 9 is a schematic top view after covering the photolithographic mask.

Specifically, in the present embodiment, as shown in FIG. 9, a photolithographic mask 300 is formed on the semiconductor structure to cover the intermediate portion and expose the terminal portion of the semiconductor structure in the width direction, so that the first semiconductor layer 110 below the photolithographic mask 300 is not etched in the subsequent steps. The material of the photolithographic mask 300 may be a photoresist, an organic polymer, silicon oxide, silicon nitride, borosilicate glass, borophosphosilicate glass, and any combination thereof. The method for forming a photolithographic mask 300 is a well known process to those skilled in the art. For the sake of brevity, no further comment is made. The function of the photolithographic mask 300 is to protect the part of the first semiconductor layer 110 in the intermediate portion in the width direction of the semiconductor structure and on both sides of the device stack. That is, after etching the first semiconductor layer 110 not covered by the photolithographic mask 300 in the subsequent steps, the part of the first semiconductor layer 110 is retained on both sides of the device stack in the intermediate portion in the width direction of the semiconductor structure. As will be described below, the position of the photolithographic mask 300 is not only limited to the position as shown in FIG. 9. Any photolithographic mask 300 that can cover the first semiconductor layer 110 located on both sides of the gate stack in the part of region in the width direction of the semiconductor structure is suitable for the manufacturing method provided by the present disclosure, which is not illustrated herein.

Figure 10A:
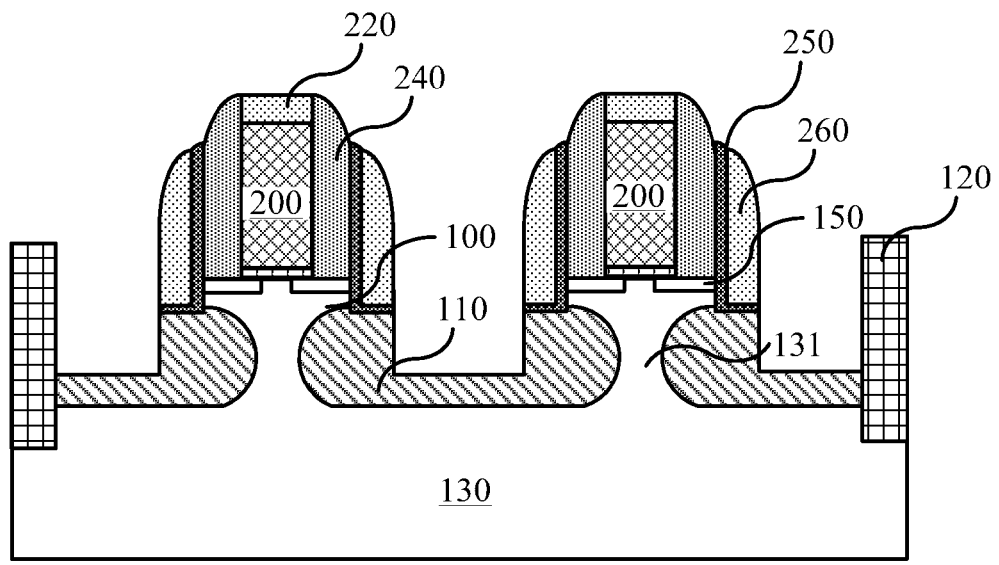
FIGS. 10a and 10b are schematic cross-sectional views of FIG. 10 along the sectional line AA' and along the sectional line BB', respectively.
Figure 10B:
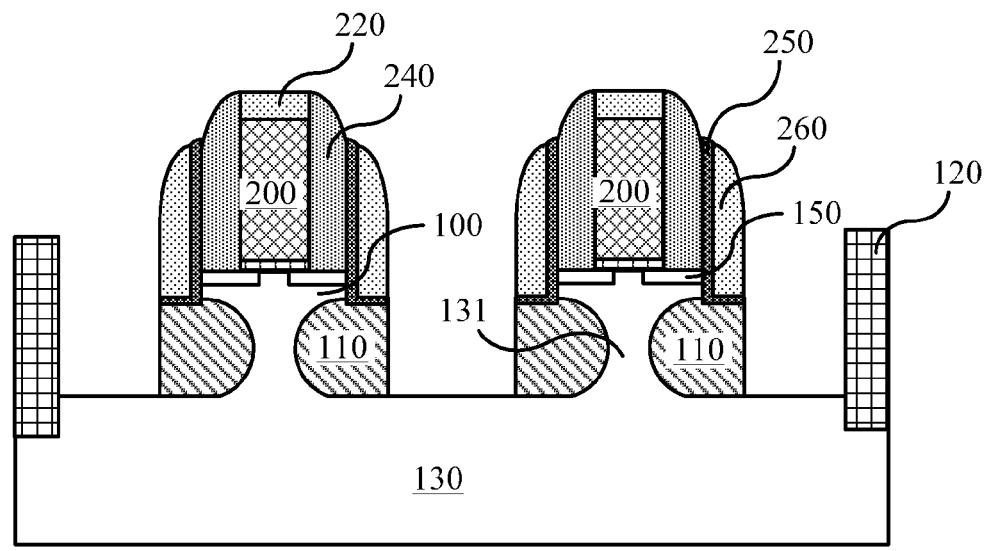

Then, the photolithographic mask 300 and the device stack with a second spacer 260 are used as a mask and the substrate 130 is used as an etching stop layer, to etch the first semiconductor layer 110 outsides the gate stack and the second spacer 260 in the two terminal regions in the width direction of the device stack (in other embodiments, in the region not covered by the photolithographic mask 300 in the width direction of the device stack) until the substrate 130 is exposed. Then, the photolithographic mask 300 is removed. Please refer to FIG. 10, 10a and FIG. 10b, wherein FIG. 10 is a top view after etching the first semiconductor layer 110 to expose part of the substrate and removing the photolithographic mask 300, and FIG. 10a and FIG. 10b are schematic sectional views of FIG. 10 along the sectional line AA' and along the sectional line BB', respectively. As shown in FIG. 10a, the first semiconductor layer 110 in the intermediate portion in the width direction of the semiconductor structure, and on both sides of the second spacer 260 and covered by the photolithographic mask 300 is retained, while the first semiconductor layer 110 in the two terminal regions in the width direction of the semiconductor structure, on both sides of the spacer 260 and not covered by the photolithographic mask 300 is removed, where the substrate below 130 is exposed, as shown in FIG. 10b. Since the selected etching is substantially anisotropic (etching substantially in the vertical direction), the part of the first semiconductor layer 110 that is protruded to be just below the device stack is retained.

In step S108, in the part of region in the width direction of the device stack, an isolation structure 123 connected to the substrate is formed below the spacer 260 and the edges of both sides of the device stack.

Figure 11:
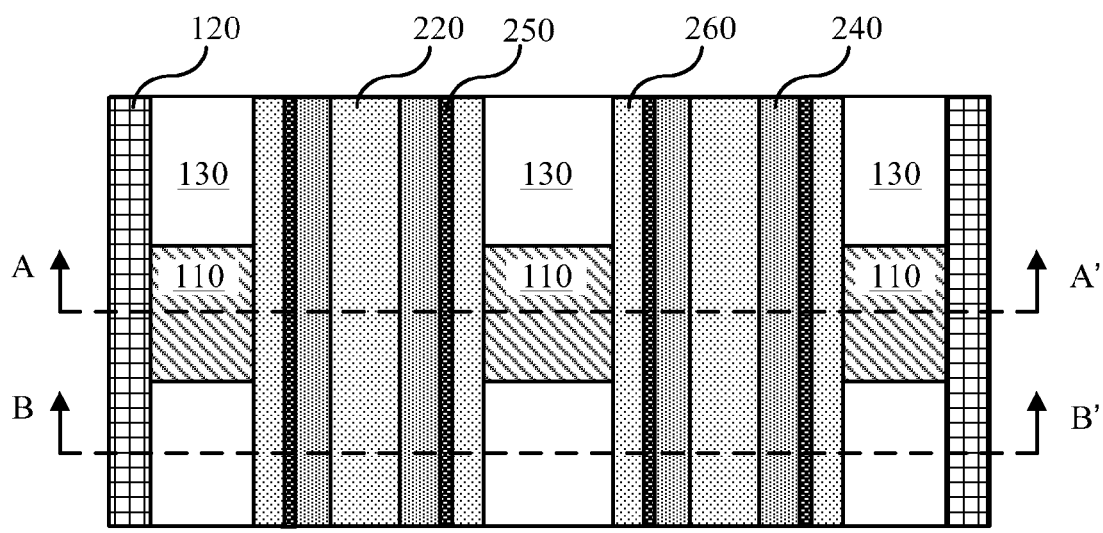
FIG. 11 is a schematic top view after lateral selective etching of the semiconductor layer.
Figure 11A:
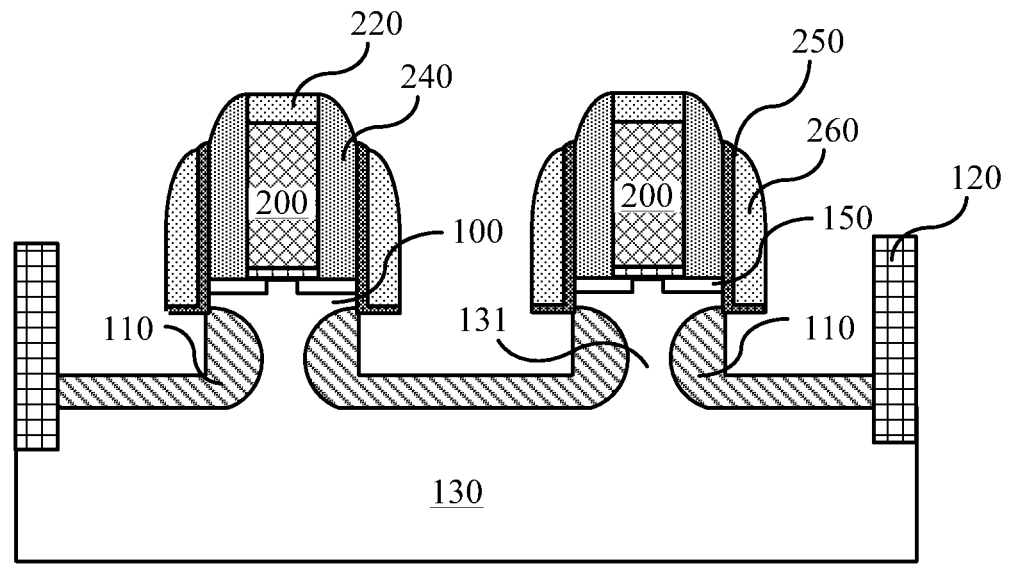
FIGS. 11a and 11b are cross-sectional views of FIG. 11 along the sectional line AA' and along the sectional line BB', respectively.
Figure 11B:
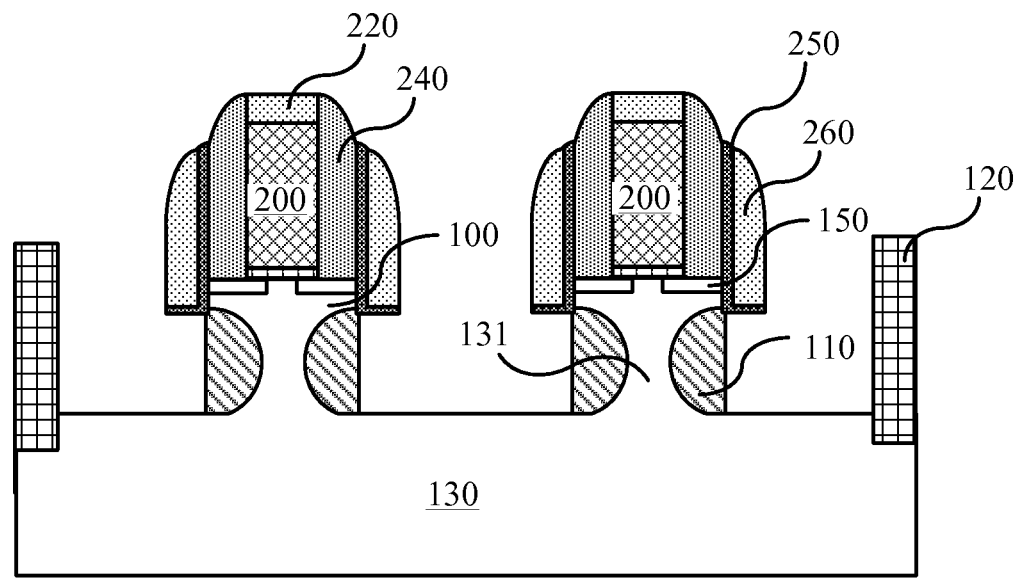

Specifically, as shown in FIG. 11, FIG. 11a and FIG. 11b, FIG. 11 is a schematic top view after lateral selective corrosion of the first semiconductor layer 110, and FIGS. 11a and 11b are schematic sectional views of FIG. 11 along the section line AA' and along the sectional line BB', respectively. As shown in the figures, the first semiconductor layer 110 located below the gate stack and the second spacer 260 is etched back.

Figure 12A:
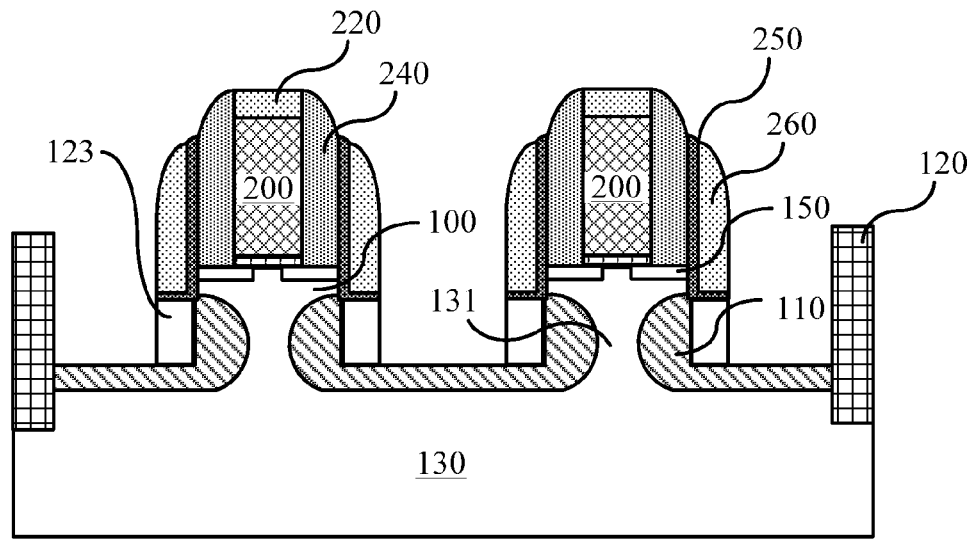
FIGS. 12a and 12b are cross-sectional views of FIG. 12 along the sectional line AA' and along the sectional line BB', respectively.
Figure 12B:
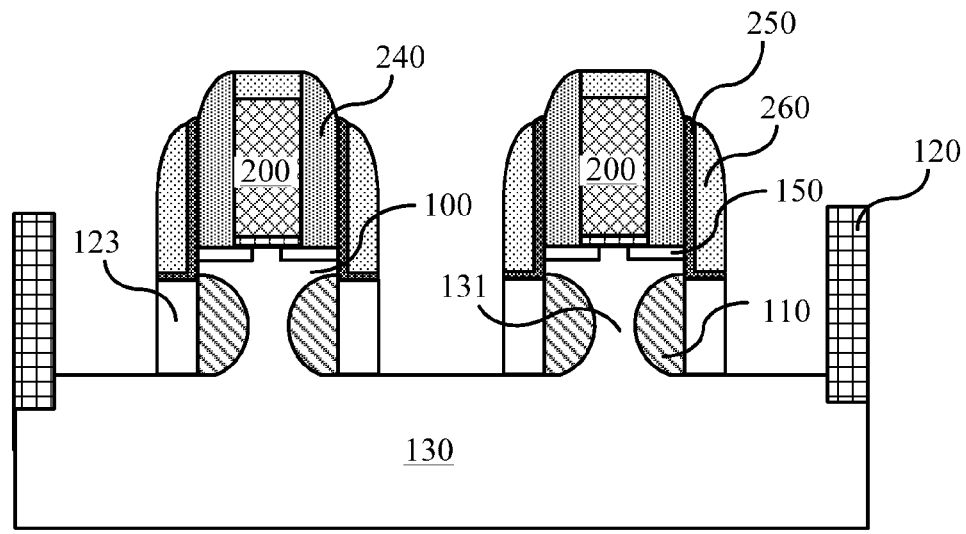

Next, as shown in FIG. 12, FIG. 12a and FIG. 12b, FIG. 12 is a schematic top view after forming an isolation structure, and FIGS. 12a and 12b are schematic sectional views of FIG. 12 along the section line AA' and along the sectional line BB', respectively. As shown in the figures, for example, a second semiconductor layer (not shown) is formed on the upper surface of the exposed substrate 130 and on the upper surface and sidewalls of the first semiconductor layer 110 by a method for epitaxial growth, and the second semiconductor layer located on the upper surface of the exposed substrate 130 and on the upper surface of the first semiconductor layer 110 is removed by an anisotropic etching mode (such as RIE, etching substantially in the vertical direction) while a second semiconductor layer located below the device stack with a second spacer 260 (mainly below the second spacer 260) is retained, to form an isolation structure 123. Laterally, the isolation structure 123 is substantially located below the second spacer 260 and below the edges of both sides of the device stack. In the present embodiment, the material of the isolation material 123 is monocrystalline silicon. In other embodiments, the material of the isolation structure 123 may be any other semiconductor material that is different from that of the first semiconductor layer 110. As shown in FIG. 12a, since in the intermediate portion in the width direction of the semiconductor structure, the first semiconductor layer 110 is not etched completely under the protection of the photolithographic mask 300 (please refer to FIG. 9), when a isolation structure 123 is formed on the sidewalls of the first semiconductor layer 110 covered previously by the photolithographic mask 300, the isolation structure 123 is formed on the first semiconductor layer 110, i.e., there is a first semiconductor layer 110 between the isolation structure 123 and the substrate 130. However, as shown in FIG. 12b, in the two terminal regions in the width direction of the semiconductor structure not protected by the photolithographic mask 300, etching stops at the surface of the substrate 130. Thus, while forming the isolation structure 123, there is no first semiconductor layer 110 below, i.e., the isolation structure 123 is directly formed on the substrate 130 and is connected to the substrate 130. Although the present embodiment illustrates the example where a isolation structure 123 is formed in the two terminal regions in the width direction of the semiconductor structure, those skilled in the art shall understand that the specific position of the isolation structure 123 is not limited to this. For example, those skilled in the art may understand that as long as it is connected to the substrate and the object of forming a cavity can be subsequently achieved, the isolation structure 123 can be located at any position in the width direction of the semiconductor structure. For the sake of simplicity, no further comment is made herein. As shown in the figures, there exists a portion that is not etched and where the first semiconductor layer 110 is protruded to be just below the device stack between the isolation structure 123 and the support structure 131.

In step S109, the remaining first semiconductor layer 110 is removed and a cavity 112 is formed between the support structure 131 and the isolation structure 123.

Figure 13:
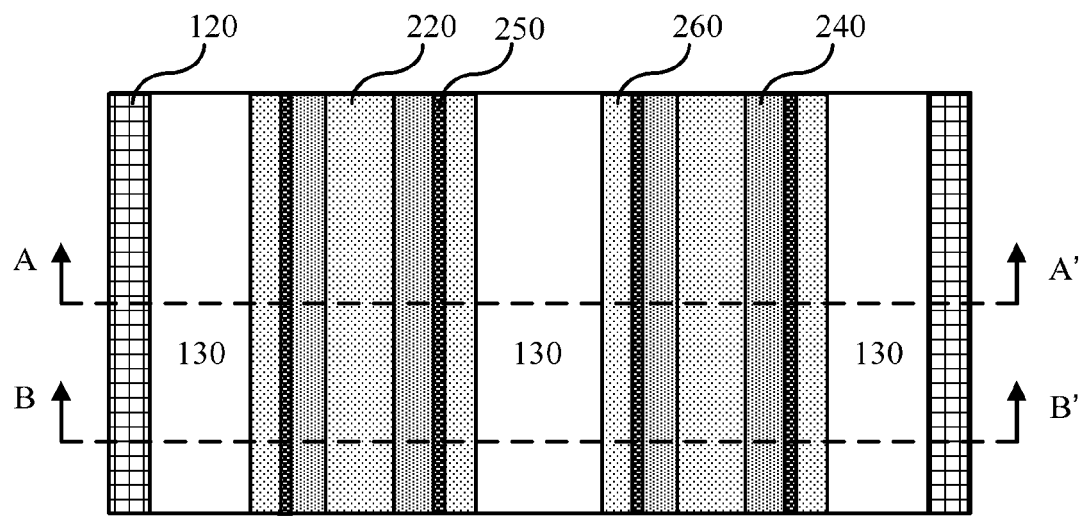
FIG. 13 a schematic top view after removing the semiconductor layer to form a cavity below the gate stack.
Figure 13A:
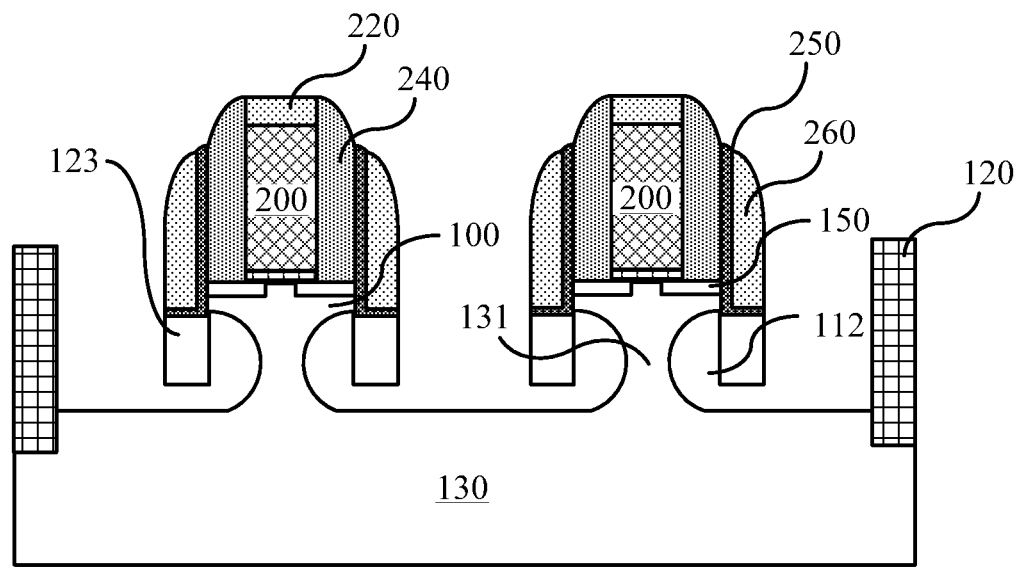
FIGS. 13a and 13b are cross-sectional views of FIG. 13 along the sectional line AA' and along the sectional line BB', respectively.
Figure 13B:
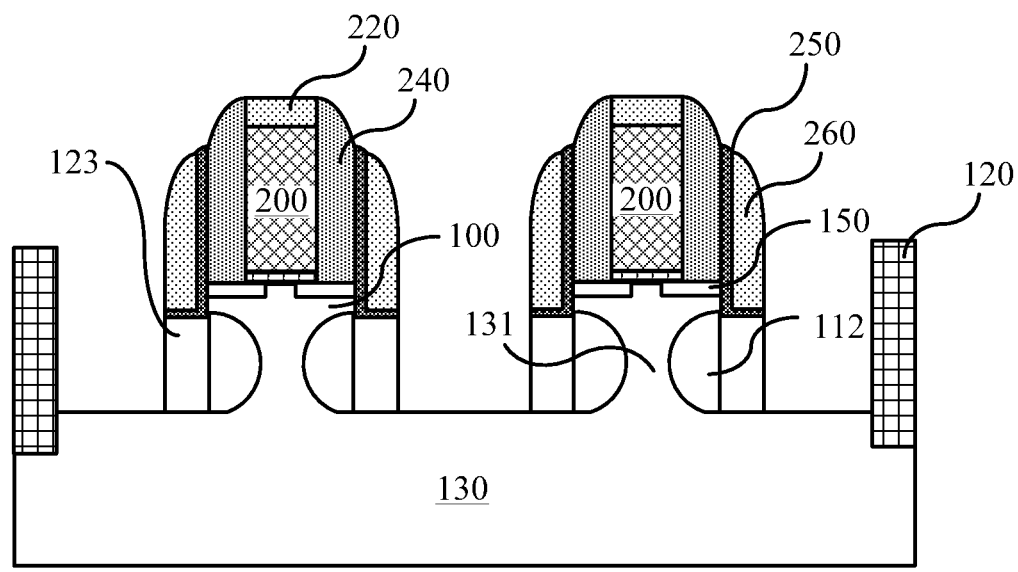

Specifically, as shown in FIG. 13, FIG. 13a and FIG. 13b, FIG. 13 is a schematic top view after removing a first semiconductor layer 110 to form a cavity 112 below the gate stack, and FIG. 13a and FIG. 13b are schematic sectional views of FIG. 13 along the sectional line AA' and along the sectional line BB', respectively. As shown in the figures, wet etching is utilized to selectively remove the remaining first semiconductor layer 110 and form a cavity 112 between the isolation structure 123 and the support structure 131 below the device stack. The cavity 112 was previously filled with the part of the first semiconductor layer 110 protruded just below the device stack. As the material of the first semiconductor layer 110 is different from that of the substrate 130, the base region 101 and the support structure 123, the remaining first semiconductor layer 110 can be selectively removed by selecting a corresponding corrosion solution. By means of the corrosion solution, the first semiconductor layer 110 located outside the isolation structure 123 is firstly corroded, and then the first semiconductor layer 110 located between the isolation structure 123 and the substrate 130 is removed. At this time, in the intermediate portion in the width of the semiconductor structure, a gap is formed between the isolation structure 123 and the substrate 130, the corrosion solution continues to corrode the first semiconductor layer 110 below the device stack through the gap, until all of the first semiconductor layer 110 is completely removed, and a cavity 112 is formed between the support structure 131 below the device stack and the isolation structure 123. At this time, as shown in FIG. 13a, as for the region where a first semiconductor layer 110 previously exists between the isolation structure 123 and the substrate 130, after the first semiconductor layer 110 is removed, a gap is formed between the isolation structure 123 and the substrate 130. As shown in FIG. 13b, as for the region where a first semiconductor layer previously does not exist between the isolation structure 123 and the substrate 130, the isolation structure 123 is connected to the substrate 130.

In step S110, the second spacer 260 is removed, and a source/drain region is formed on both sides of the device stack.

Specifically, as shown in FIG. 14, FIG. 14a and FIG. 14b, FIG. 14 is a schematic top view after filling stress materials on both sides of the gate stack, and FIGS. 14a and 14b are cross-sectional views of FIG. 14 along the sectional line AA' and along the sectional line BB', respectively. As shown in the figures, first, the etching stop layer 250 is used as the etching stop layer to remove the second spacer 260 by a dry etching method. Then, the first spacer 240 is used as an etching stop layer to further remove the etching stop layer 250 by a dry etching method so as to expose the device stack. And then, both sides of the device are filled with a stress material to form a source/drain region 113, wherein the upper surface of the source/drain region 130 is preferably higher than or at the same level as the bottom of the gate stack. Due to the presence of the isolation structure 123, the stress material is substantially present outside the isolation structure 123 so as to ensure that the cavity 112 is not filled. As shown in FIG. 14a, in the region where the isolation structure 123 does not directly contact the substrate 130, since there exists a certain gap between the isolation structure 123 and the substrate 130, a small amount of stress materials will enter into the cavity 112 from the gap. The small amount of stress materials are accumulated to form a barrier after entering into the gap. As a result, only such a part of stress materials enters into the cavity 112, and a majority of stress materials are isolated outside. As shown in FIG. 14b, in the region where the isolation structure 123 and the substrate 130 are connected, the stress material is completed blocked outside the cavity 112 by the isolation structure 123.

The method for forming the source/drain region 113 is preferably epitaxial growth. As for PFET devices, the material of the source/drain region 113 is boron-doped $Si_{1-x}Ge_x$, wherein X ranges from 0.1 to 0.7, such as 0.2, 0.3, 0.4, 0.5 or 0.6. As for NFET devices, the material of the source/drain region 113 is phosphorus or arsenic-doped Si:C, wherein the percentage of C ranges from 0.2% to 2%, such as 0.5%, 1% or 1.5%. The presence of the stress material silicon germanium or silicon carbide is advantageous for further regulating the stress within the channel region so as to enhance the mobility of carriers within the channel region. Besides, due to the presence of silicon germanium or silicon carbide, for PFET devices, after filling of a doped stress material, an N-type super steep retrograde well is formed; and for NFET devices, after filling of a doped stress material, a P-type super steep retrograde well is formed.

Compared with the prior art, the present disclosure has the following advantages. Since there exists a cavity below the channel, the stress of the stress material source/drain region located on both sides of the channel can act on the channel more concentratedly, thereby effectively enhancing the impact of stress on the channel carrier mobility and enhancing control on the channel performance. Furthermore, the presence of the cavity below the channel is also beneficial to enhance the steepness of the source/drain region, thereby suppressing the short channel effect and improving the performance of the semiconductor structure.

While the exemplary embodiments and advantages thereof have been described in detail, it should be understood that various changes, substitutions and modifications can be made to these embodiments without departing from the spirit of the disclosure and the scope of protection defined by the appended claims. For other examples, those skilled in the art should readily understand that the order of process steps can be varied while maintaining the scope of protection of the present disclosure.

In addition, the range of applications of the present disclosure is not limited to the processes, institutions, manufacturing, composition of matter, means, methods and steps of the specific embodiments described in the description. In accordance with the disclosure of the present disclosure, those skilled in the art may readily understand that as for the processes, institutions, manufacturing, composition of matter, means, methods, or steps currently existing or to be developed later in which they implement substantially the same function or achieve substantially the same result as the corresponding embodiments descried in the present disclosure, they can be applied in accordance with the present disclosure. Accordingly, the appended claims of the present disclosure seek to include these processes, institutions, manufacturing, composition of matter, means, methods, or steps within the scope of its protection.

The invention claimed is:

1. A semiconductor structure, comprising a substrate (130), a support structure (131), a base region (100), a gate stack, a spacer (240) and a source/drain region, wherein the gate stack is located on the base region (100), and the base region (100) is supported on the substrate (130) by the support structure (131), wherein:
    the sidewall cross-section of the support structure (131) is in a shape of concave curve;
    an isolation structure (123) is formed below edges on both sides of the base region (100), wherein part of the isolation structure (123) is connected to the substrate (130);
    a cavity (112) is formed between the isolation structure (123) and the support structure (131); and
    a source/drain region is formed at least on both sides of the base region (100) and the isolation structure (123).

2. The semiconductor structure according to claim 1, further comprising a source/drain extension region located in the base region.

3. The semiconductor structure according to claim 1, wherein the material of the isolation structure (123) comprises silicon.

4. The semiconductor structure according to claim 1, wherein silicon germanium or silicon carbide is sandwiched between the substrate (130) and other parts of the isolation structure (123) except the part which is in direct contact with the substrate (130).

5. The semiconductor structure according to claim 1, wherein the material of the substrate (130) comprises silicon.

6. The semiconductor structure according to claim 1, wherein the material of the source/drain region comprises silicon germanium or silicon carbide.

* * * * *